(12) United States Patent
Lee

(10) Patent No.: US 6,399,551 B1
(45) Date of Patent: *Jun. 4, 2002

(54) ALKANOLAMINE SEMICONDUCTOR PROCESS RESIDUE REMOVAL PROCESS

(75) Inventor: Wai Mun Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/444,548

(22) Filed: Nov. 22, 1999

Related U.S. Application Data

(60) Division of application No. 08/815,616, filed on Mar. 11, 1997, now Pat. No. 6,121,217, which is a continuation-in-part of application No. 08/628,060, filed on Apr. 17, 1996, now Pat. No. 6,187,730, which is a continuation-in-part of application No. 08/078,657, filed on Jun. 21, 1993, now abandoned.

(51) Int. Cl.[7] .............................. C11D 7/32; C11D 7/50; C11D 7/26
(52) U.S. Cl. ............... 510/175; 510/176; 510/178; 510/245; 510/255; 510/264; 510/271; 510/499; 510/477; 510/488; 134/1.2; 134/1.3; 134/39
(58) Field of Search ............... 510/175, 176, 510/178, 245, 255, 264, 271, 499, 477, 488; 134/1.2, 1.3, 39

(56) References Cited

U.S. PATENT DOCUMENTS

| | | | |
|---|---|---|---|
| 3,160,539 A | 12/1964 | Hall et al. ............... | 156/17 |
| 3,530,186 A | 9/1970 | Greco .................... | 260/571 |
| 3,582,401 A | 6/1971 | Berilla et al. ............ | 134/3 |
| 3,649,395 A | 3/1972 | Lee ....................... | 156/17 |
| 3,753,933 A | 8/1973 | Olstowski ................ | 260/2.5 |
| 4,111,767 A | * 9/1978 | Kawagishi et al. ......... | 204/146 |
| 4,155,866 A | 5/1979 | Berkenblit et al. ........ | 156/647 |
| 4,165,294 A | 8/1979 | Vander Mey .............. | 134/42 |
| 4,221,674 A | 9/1980 | Vander Mey .............. | 134/42 |
| 4,238,275 A | 12/1980 | Shih ..................... | 156/626 |
| 4,239,661 A | 12/1980 | Muraoka et al. ........... | 134/42 |
| 4,242,218 A | 12/1980 | Vander Mey .............. | 134/38 |
| 4,264,716 A | 4/1981 | Vincent et al. ........... | 430/380 |

(List continued on next page.)

FOREIGN PATENT DOCUMENTS

| | | |
|---|---|---|
| GB | 1144481 | 3/1969 |
| JP | 55-52379 | 4/1980 |
| JP | 56-5899 | 1/1981 |
| JP | 62-49355 | 3/1987 |
| JP | 62-95531 | 5/1987 |
| JP | 63-183445 | 7/1988 |
| JP | 64-21088 | 1/1989 |
| JP | 1-105949 | 4/1989 |
| JP | 1-159388 | 6/1989 |
| JP | 5-259066 | 10/1993 |

OTHER PUBLICATIONS

MSDS, Experimental Stripper, WMX–225 (1 sheet).

*Primary Examiner*—Gregory Delcotto
(74) *Attorney, Agent, or Firm*—Pennie & Edmonds, LLP

(57) ABSTRACT

A two carbon atom linkage alkanolamine compound composition comprises the two carbon atom linkage alkanolamine compound, gallic acid or catechol, and optionally, an aqueous hydroxylamine solution. The balance of the composition is made up of water, preferably high purity deionized water, or another suitable polar solvent. A process for removing photoresist or other residue from a substrate, such as an integrated circuit semiconductor wafer including titanium metallurgy, comprises contacting the substrate with the composition for a time and at a temperature sufficient to remove the photoresist or other residue from the substrate. Use of the two carbon atom linkage alkanolamine compound in the composition and process provides superior residue removal without attacking titanium or other metallurgy, oxide or nitride layers on the substrate.

13 Claims, 4 Drawing Sheets

U.S. PATENT DOCUMENTS

| | | | |
|---|---|---|---|
| 4,268,406 A | * 5/1981 | O'Brien et al. | |
| 4,276,185 A | 6/1981 | Martin | |
| 4,278,635 A | 7/1981 | Kerst | 422/14 |
| 4,279,870 A | 7/1981 | Natansohn et al. | 423/54 |
| RE30,714 E | 8/1981 | Harriman et al. | 134/2 |
| 4,282,111 A | 8/1981 | Ciuba | 210/749 |
| 4,284,435 A | 8/1981 | Fox | 132/2 |
| 4,289,645 A | 9/1981 | Muccitelli | 422/13 |
| RE30,796 E | 11/1981 | Lesinski | 134/2 |
| 4,395,348 A | 7/1983 | Lee | 252/143 |
| 4,482,626 A | 11/1984 | Twist et al. | 430/380 |
| 4,539,230 A | 9/1985 | Shimizu et al. | 427/230 |
| 4,549,968 A | 10/1985 | Muccitelli | 210/750 |
| 4,595,519 A | 6/1986 | Takano et al. | 510/255 |
| 4,617,251 A | 10/1986 | Sizensky | 430/256 |
| 4,626,411 A | 12/1986 | Nemes et al. | 422/13 |
| 4,699,868 A | 10/1987 | Sabongi | 430/264 |
| 4,732,887 A | 3/1988 | Obanawa et al. | 502/402 |
| 4,737,195 A | 4/1988 | Carandang et al. | 134/38 |
| 4,824,763 A | 4/1989 | Lee | 430/258 |
| 4,824,949 A | 4/1989 | Lee | 430/258 |
| 4,834,912 A | 5/1989 | Hodgens et al. | 134/2 |
| 4,861,386 A | 8/1989 | Hoy | 134/2 |
| 4,873,136 A | 10/1989 | Foust et al. | 428/209 |
| 4,895,703 A | 1/1990 | Zupanovich et al. | 422/14 |
| 4,929,301 A | 5/1990 | Beechko | 252/79.1 |
| 4,941,941 A | 7/1990 | Austin et al. | 156/647 |
| 4,980,077 A | 12/1990 | Morris et al. | 132/2 |
| 5,015,298 A | 5/1991 | Arrington | 132/2 |
| 5,022,926 A | 6/1991 | Kreh et al. | 132/2 |
| 5,049,201 A | 9/1991 | Cheng et al. | 134/42 |
| 5,073,622 A | 12/1991 | Wojtech et al. | 528/486 |
| 5,091,103 A | 2/1992 | Dean et al. | 510/176 |
| 5,185,235 A | 2/1993 | Sato et al. | 430/331 |
| 5,279,771 A | * 1/1994 | Lee | 252/548 |
| 5,288,332 A | 2/1994 | Pastilnik et al. | 132/2 |
| 5,290,361 A | 3/1994 | Hayashida et al. | 132/2 |
| 5,308,745 A | 5/1994 | Schwartzkopf | 430/329 |
| 5,334,332 A | * 8/1994 | Lee | 252/548 |
| 5,381,807 A | * 1/1995 | Lee | 134/2 |
| 5,399,464 A | 3/1995 | Lee | 430/329 |
| 5,407,788 A | 4/1995 | Fang | 134/38 |
| 5,417,877 A | * 5/1995 | Ward | 252/153 |
| 5,419,779 A | * 5/1995 | Ward | 134/38 |
| 5,482,566 A | * 1/1996 | Lee | 134/42 |
| 5,496,491 A | 3/1996 | Ward et al. | 252/153 |
| 5,554,312 A | 9/1996 | Ward | 510/175 |
| 5,556,482 A | 9/1996 | Ward et al. | 134/38 |
| 5,563,119 A | 10/1996 | Ward | 510/176 |
| 5,672,577 A | * 9/1997 | Lee | 510/175 |
| 5,902,780 A | * 5/1999 | Lee | 510/176 |
| 5,911,835 A | * 6/1999 | Lee et al. | 134/1.3 |
| 5,928,430 A | * 7/1999 | Ward et al. | 134/1.3 |
| 5,981,454 A | * 11/1999 | Small | 510/175 |
| 6,000,411 A | * 12/1999 | Lee | 134/1.2 |

* cited by examiner

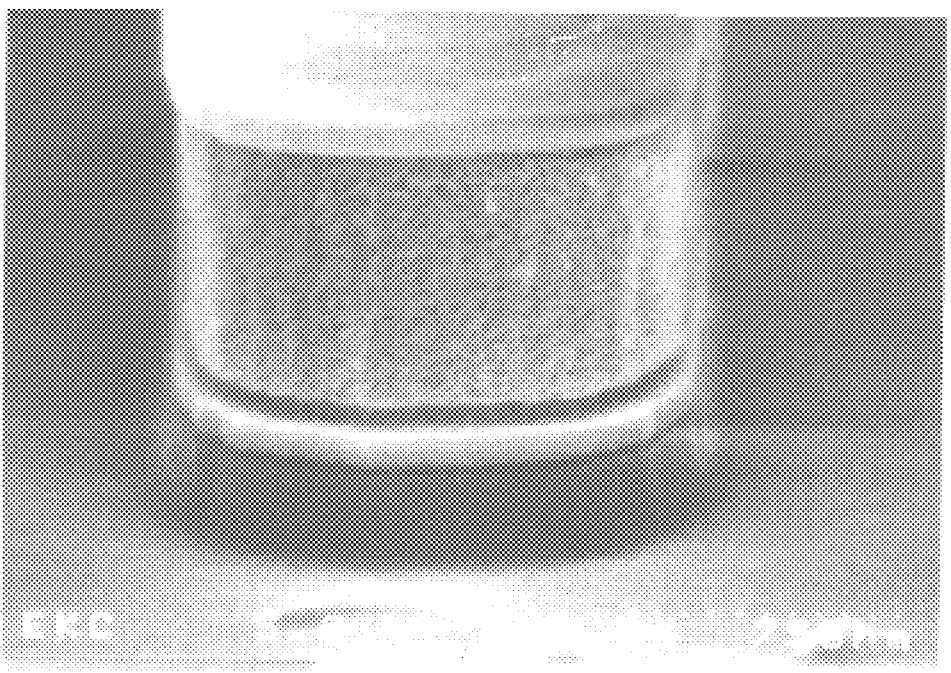
FIG._1
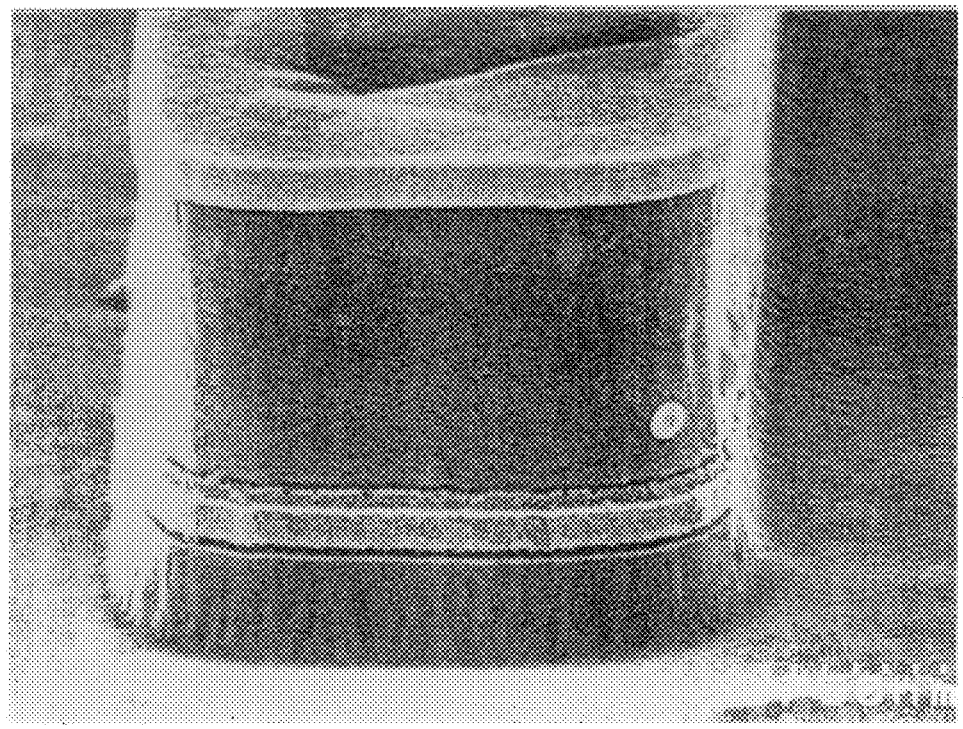
FIG._2

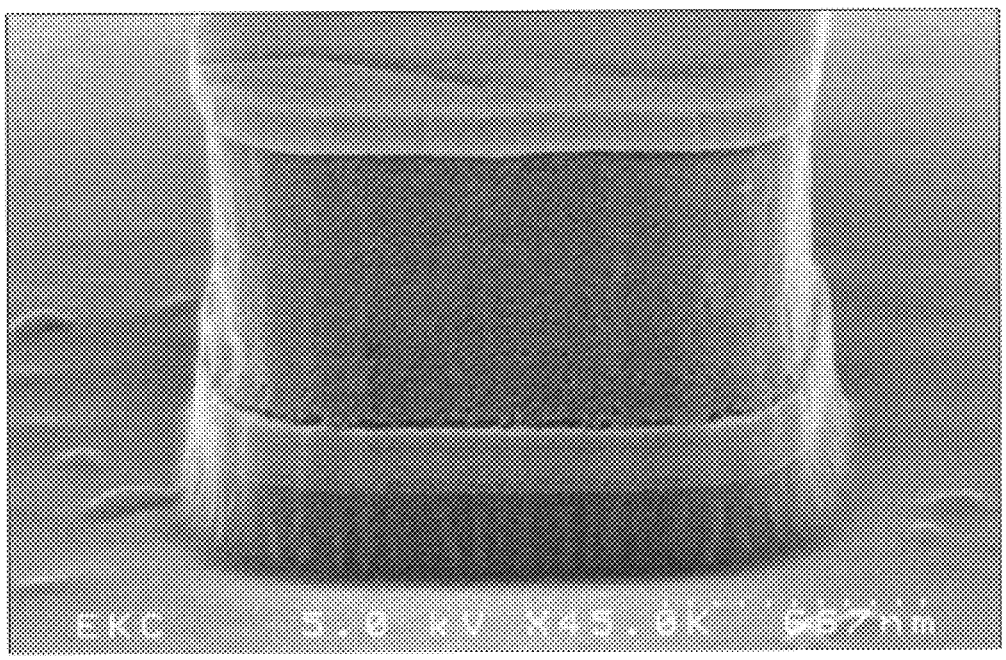
FIG._3
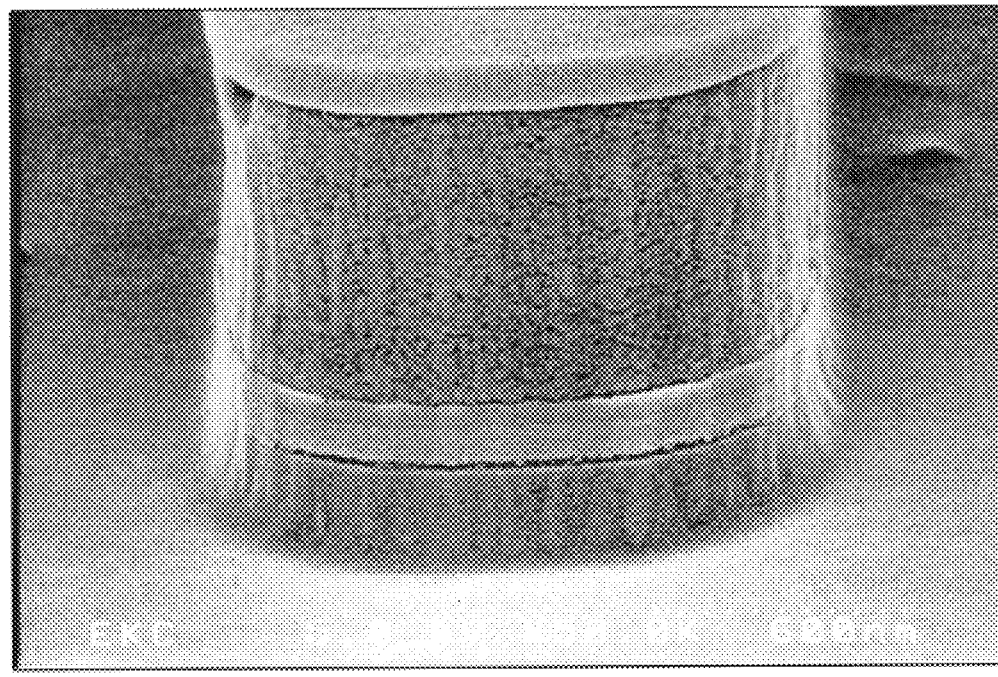
FIG._4

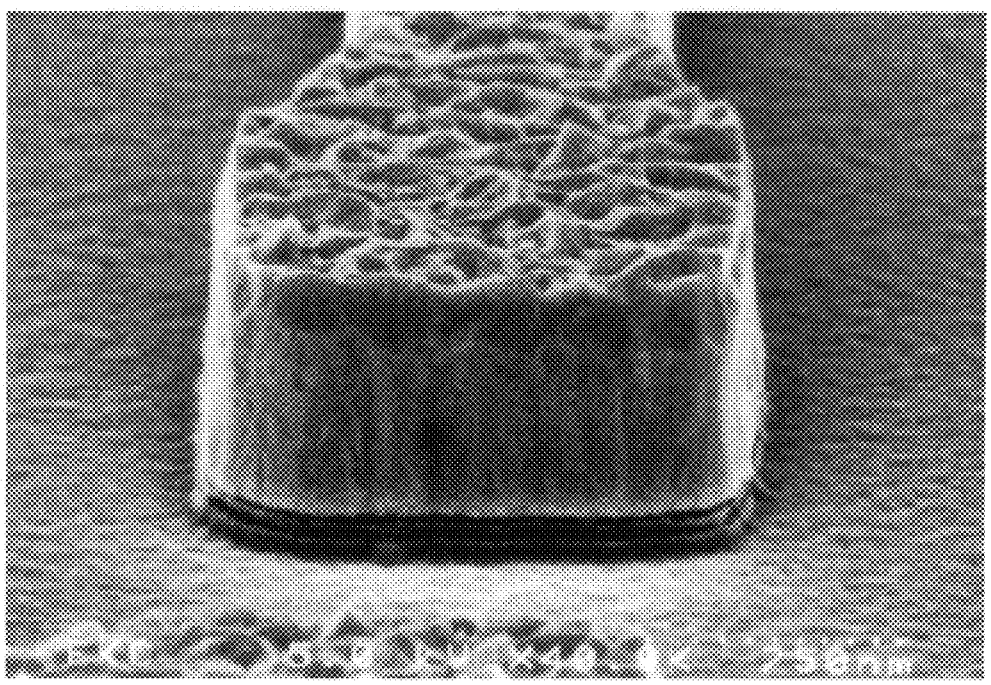
FIG._5
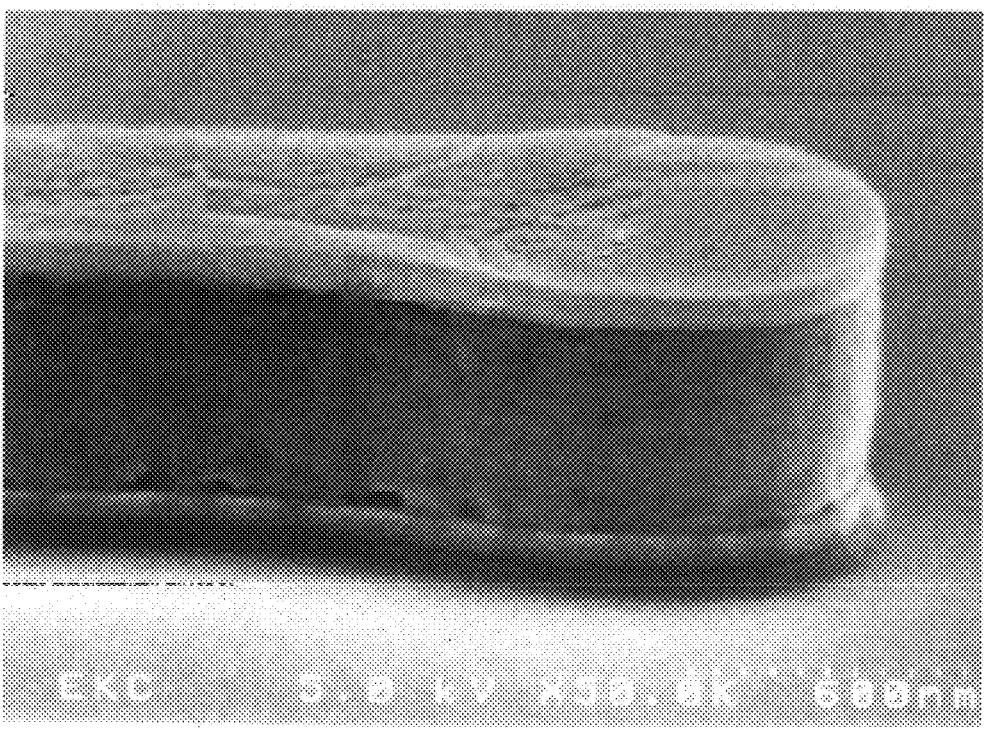
FIG._6

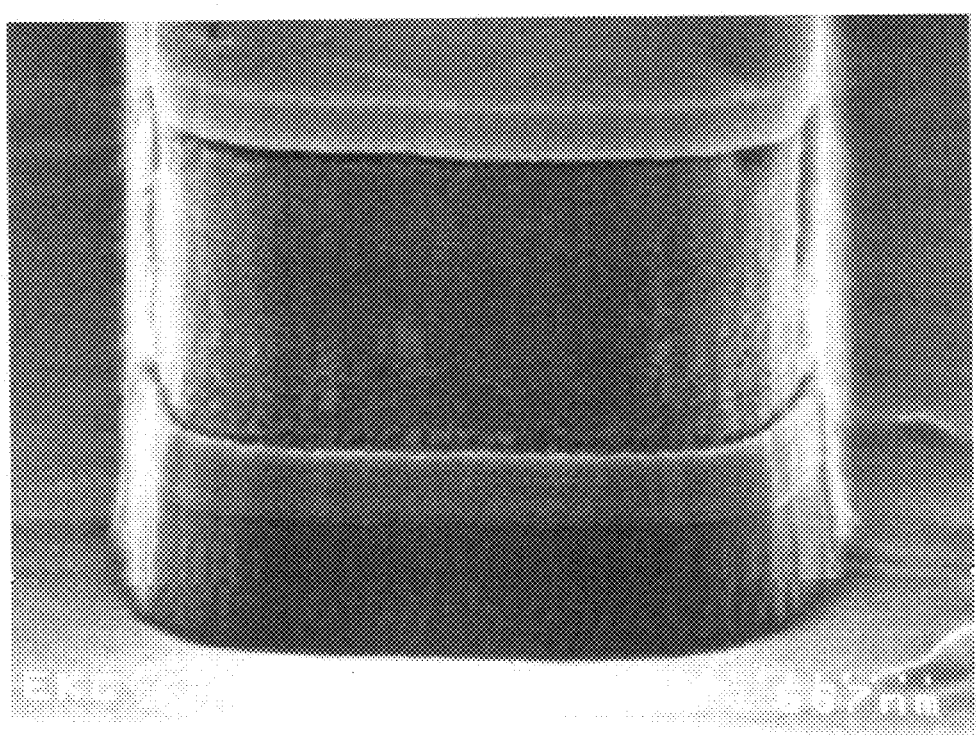
FIG._7
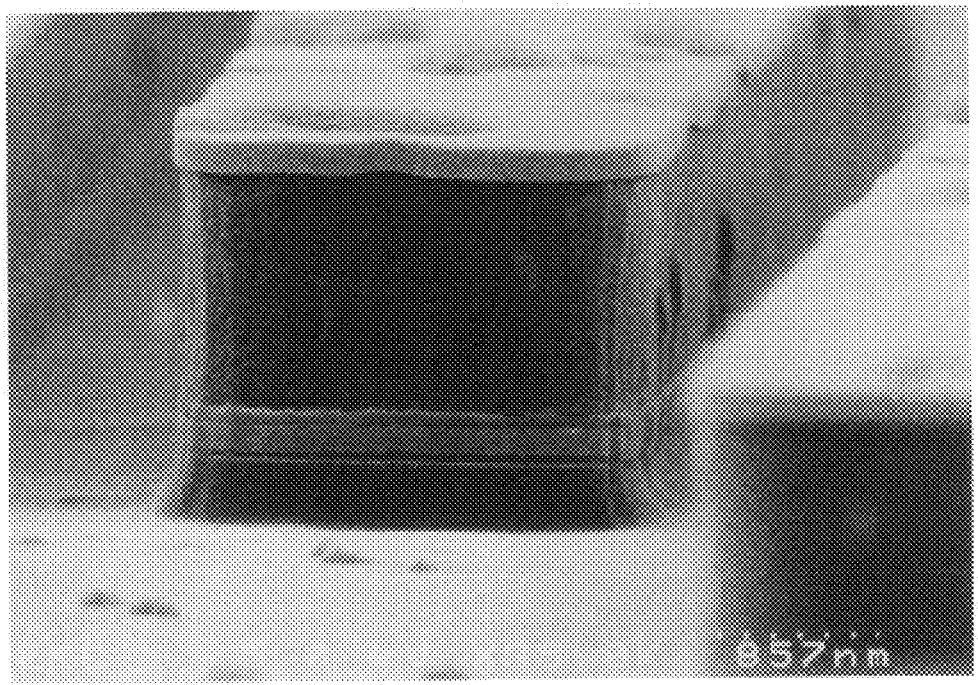
FIG._8

ALKANOLAMINE SEMICONDUCTOR PROCESS RESIDUE REMOVAL PROCESS

CROSS REFERENCE TO RELATED APPLICATIONS

This application is a is a divisional of application Ser. No. 08/815,616 filed Mar. 11, 1997, now U.S. Pat. No. 6,121,217, which is a continuation-in-part of application Ser. No. 08/628,060 filed Apr. 17, 1996, now U.S. Pat. No. 6,187,730, which is a continuation-in-part of application Ser. No. 08/078,657 filed Jun. 21, 1993, now abandoned, the disclosures of which are incorporated herein by reference thereto.

BACKGROUND OF THE INVENTION

1. Field of the Invention

The present invention relates generally to a cleaning composition and process for removal of organic, organometallic and metal oxide residues from substrates. More particularly, it relates to such a composition and process for removing semiconductor device fabrication residues from semiconductor device substrates, such as etching residues after plasma etching processes in the fabrication of integrated circuits on silicon wafers and similar processes. Most especially, it relates to such a composition and process which is effective for the removal of these materials while avoiding substantial attack on metal or insulation layers employed in integrated circuits, including titanium layers.

2. Description of the Prior Art

As integrated circuit manufacturing has become more complex and the dimensions of circuit elements fabricated on silicon or other semiconductor wafers have become smaller, continued improvement in techniques used to remove residues formed from such materials has been required. Oxygen plasma oxidation is often used for removal of photoresist or other polymeric materials after their use during the fabrication process has been completed. Such high energy processes typically result in the formation of organometallic and other residues on sidewalls of the structures being formed in the fabrication process.

A variety of metal and other layers are commonly employed in integrated circuit fabrication, including aluminum, aluminum/silicon/copper, titanium, titanium nitride, titanium/tungsten, tungsten, silicon oxide, polysilicon crystal, and the like. The use of such different layers results in the formation of different organometallic residues in the high energy processes. In addition to being effective for removing such residues, stripping and cleaning compositions should also not attack the different metallurgies or insulation layers used in integrated circuit fabrication.

A variety of residue removal compositions and processes suitable for integrated circuit fabrication have been developed and marketed by EKC Technology, Inc., the assignee of the present application. Some of these compositions and processes are also useful for stripping photoresist, polyimide or other polymeric layers from substrates in integrated circuit fabrication, and EKC has also developed a variety of compositions and processes for stripping such polymeric layers from substrates in integrated circuit fabrication. Such compositions and processes are disclosed in the following commonly assigned issued patents: U.S. Pat. No. 5,482,566, issued Jan. 9, 1996 to Lee; U.S. Pat. No. 5,399,464, issued Mar. 21, 1995 to Lee; U.S. Pat. No. 5,381,807, issued Jan. 17, 1995 to Lee; U.S. Pat. No. 5,334,332, issued Aug. 2, 1994 to Lee; U.S. Pat. No. 5,279,771, issued Jan. 18, 1994 to Lee; U.S. Pat. No. 4,824,763, issued Apr. 25, 1989 to Lee and U.S. Pat. No. 4,395,348, issued Jul. 26, 1983 to Lee. These compositions have achieved substantial success in integrated circuit fabrication applications. However, further development of integrated circuits and their fabrication processes have created a need for improvement in residue removal compositions and processes.

As a result of a continuous effort to decrease critical dimension size in the integrated circuit industry, such as in the fabrication of sub-micron size devices, etching residue removal and substrate compatibility with chemicals employed in wet processing is becoming more and more critical for obtaining acceptable yield in very large scale integration (VLSI) and ultra large scale integration (ULSI) processes. The composition of such etching residue is generally made up of the etched substrates, underlying substrate, photoresist and etching gases. The substrate compatibility of the wafers with wet chemicals is highly dependent on the processing of the polysilicon, multilevel interconnection dielectric layers and metallization in thin film deposition, etching and post-etch treatment of the wafers, which are often quite different from one fabrication process to another. Some of the above compositions have produced corrosion on certain metal substrates, such as those including a titanium metal layer. Titanium has become more widely used in semiconductor manufacturing processes. It is employed both as a barrier layer to prevent electromigration of certain atoms and as an antireflector layer on top of other metals.

SUMMARY OF THE INVENTION

Accordingly, it is an object of this invention to provide an improved composition for residue removal and process using such a composition suitable for meeting current semiconductor fabrication requirements.

It is another object of the invention to provide such a composition and process which is suitable for removing residues from wafers and other substrates including one or more titanium metal layers without substantial attack on such titanium layers.

The attainment of these and related objects may be achieved through use of the residue removal composition and process herein disclosed. A residue removal composition in accordance with this invention comprises a two carbon atom linkage alkanolamine compound, gallic acid or catechol, optionally, an aqueous hydroxylamine solution, and desirably a balance of water or another suitable polar solvent. A process for removing a residue from a substrate in accordance with this invention comprises contacting the substrate with a composition that contains a two carbon atom linkage alkanolamine compound for a time and at a temperature sufficient to remove the residue from the substrate.

In practice, we have found that use of a two carbon atom linkage alkanolamine compound gives a residue removing composition that attacks titanium substantially less than prior compositions. At the same time, the two carbon atom linkage alkanolamine compound containing composition gives equivalent performance as a residue removing composition.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIGS. 1–8 are scanning electron microscope (SEM) photographs showing comparative results achieved using the composition and process of the present invention.

DETAILED DESCRIPTION OF THE INVENTION

The two carbon atom linkage alkanolamine compounds suitable for use in the invention have the structural formula

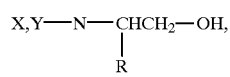

wherein X and Y are, independently in each case, hydrogen, methyl or ethyl, and R is hydrogen or an alkyl group containing from 1 to 4 carbon atoms. The two carbon atom linkage alkanolamine compounds useful in the present invention preferably have relatively high boiling points, such as for example, 75° C. or above. Preferred specific examples of such two carbon atom linkage alkanolamine compounds include monoethanolamine and monoisopropanolamine.

The composition desirably contains at least about 10% by weight of at least one two carbon atom linkage alkanolamine compound, from about 5% to about 40% by weight of gallic acid, catechol or other chelating agent, and optionally, up to about 50 percent by weight of a 50% by weight aqueous hydroxylamine solution. The balance of the composition is desirably made up of water, preferably high purity deionized water, or another suitable polar solvent. The solvents can be used singly or as mixtures. The composition preferably includes from about 10% to about 80% by weight of at least one two carbon atom linkage alkanolamine compound, from about 5% to about 30% by weight of the gallic acid or catechol, from about 10% to about 30% of the hydroxylamine solution, with the remaining balance preferably being water or other suitable polar solvent.

In practice, it appears that the catechol or gallic acid enhances the ability of the two carbon atom linkage alkanolamine compound to remove the residue. At the same time, the presence of the catechol, gallic acid or other chelating agent helps to prevent attack on titanium metallurgy.

Suitable examples of polar solvents for the composition, in addition to water, include dimethyl sulfoxide, ethylene glycol, ethylene glycol alkyl ether, diethylene glycol alkyl ether, triethylene glycol alkyl ether, propylene glycol, propylene glycol alkyl ether, dimethyl sulfoxide, N-substituted pyrrolidone, ethylenediamine and ethylenetriamine. Additional polar solvents as known in the art can also be used in the composition of the present invention.

The residue cleaning compositions of the present composition are effective in removing organometallic and metal oxide residue from a variety of integrated circuit silicon wafer substrates, including metal layers, such as aluminum or titanium, oxide layers, such as silicon oxides, nitride layers, such as silicon nitride, and the like. The cleaning compositions of the present invention are also effective in removing organometallic and metal oxide residue generated on the substrate of etching equipment utilized in the fabrication of integrated circuits. Examples of commercially available etching equipment include that available from Lam Research, Tegal, Electrotech, Applied Materials, Tokyo Electron, Hitachi and the like.

The method of cleaning a substrate using the cleaning compositions of the present invention involves contacting a substrate having organometallic and metal oxide residue thereon with a stripping and cleaning composition of the present invention for a time and at a temperature sufficient to remove the residue. The substrate is generally immersed in the stripping and cleaning composition. The time and temperature are determined based on the particular material being removed from a substrate. Generally, the temperature is in the range of from about ambient or room temperature to about 120° C. and the contact time is from about 2 to 60 minutes.

The substrate may then be rinsed in a polar solvent, such as isopropyl alcohol, followed by a deionized water rinse. The substrate is then mechanically dried, such as with a spin drier, or nitrogen blow dried.

The following represent non-limiting examples and describe the invention further.

Examples of cleaning compositions according to the present invention suitable for removing resist or other organic residues from a substrate are set forth in Table I below.

TABLE 1

| Cleaning Composition | Alkanolamine Wt. % | Gallic Acid/Catechol Wt. % | Hydroxyl-Amine Wt. % | Additional Solvent Wt. % |
|---|---|---|---|---|
| A | 60% DGA | 5% Catechol | 30% (50 Wt % Aq. Sol'n) | |
| B | 55% MIPA | 10% gallic acid | 30% (50 Wt % Aq. Sol'n.) | 5% Water |
| C | 60% MEA | | 35% (50 Wt % Aq. Sol'n.) | 5% Water |
| D | 60% MEA | 5% gallic acid | 35% (50 Wt % Aq. Sol'n.) | |
| E | 60% MIPA | 5% Catechol | 35% (50 Wt % Aq. Sol'n.) | |
| F | 30% MEA 25% MIPA | 10% Catechol | 30% (50 Wt % Aq. Sol'n.) | 5% Water |
| G | 30% MEA 25% MIPA | 10% gallic acid | 30% (50 Wt % Aq. Sol'n.) | 5% Water |
| H | 55% DGA | 10% gallic acid | 30% (50 Wt % Aq. Sol'n.) | 5% Water |

Abbreviations:
DGA = diglycolamine
MEA = monoethanolamine
MIPA = monoisopropanolamine

EXAMPLE 1

A semiconductor wafer having a patterned metal stack consisting of $TiN/Al/Ti/TiN/Ti/SiO_2$ was treated with composition A at 75° C. for 30 minutes to remove process residue from the wafer, for comparative purposes. FIG. 1 is a scanning electron microscope (SEM) photograph of the wafer after this treatment. Substantial undercutting of both Ti layers are visible in this photograph.

EXAMPLE 2

A semiconductor wafer having a patterned metal stack consisting of $TiN/Al/Ti/TiN/Ti/SiO_2$ was treated with composition B at 75° C. for 30 minutes to remove process residue from the wafer. FIG. 2 is a SEM photograph of the wafer after this treatment. No undercutting of the lower Ti layer is visible, and a slight undercutting of the upper Ti layer is visible.

EXAMPLE 3

A semiconductor wafer having a patterned metal stack consisting of TiN/Al/Ti/TiN/Ti/SiO$_2$ was treated with composition C at 75° C. for 30 minutes to remove process residue the wafer, as a control. FIG. 3 is a SEM photograph of the wafer after this treatment. Undercutting of both Ti layers is visible.

EXAMPLE 4

A semiconductor wafer having a patterned metal stack consisting of TiN/Al/Ti/TiN/Ti/SiO$_2$ was treated with composition D at 75° C. for 30 minutes to remove process residue from the wafer. FIG. 4 is a SEM photograph of the wafer after this treatment. A slight undercutting of the lower Ti layer is visible, and no undercutting of the upper Ti layer is visible.

EXAMPLE 5

A semiconductor wafer having a patterned metal stack consisting of W/Ti/SiO$_2$ was treated with composition E at 75° C. for 30 minutes to remove process residue from the wafer. FIG. 5 is a SEM photograph of the wafer after this treatment. No undercutting of the Ti layer is visible.

EXAMPLE 6

A semiconductor wafer having a patterned metal stack consisting of TiN//Ti/Al/Ti/TiN/BPSG (boron phosphosilicate glass) was treated with composition F at 75° C. for 30 minutes to remove process residue from the wafer. FIG. 6 is a SEM photograph of the wafer after this treatment. No undercutting of the Ti layers is visible.

EXAMPLE 7

A semiconductor wafer having a patterned metal stack consisting of TiN/Al/Ti/TiN/Ti/SiO$_2$ was treated with composition G at 75° C. for 30 minutes to remove process residue from the wafer. FIG. 7 is a SEM photograph of the wafer after this treatment. No undercutting of the Ti layers is visible.

EXAMPLE 8

A semiconductor wafer having a patterned metal stack consisting of TiN/Al/Ti/TiN/Ti/SiO$_2$ was treated with composition H at 75° C. for 30 minutes to remove process residue from the wafer, for comparative purposes. FIG. 8 is SEM photograph of the wafer after this treatment. Undercutting of the Ti layers is visible.

The above examples show that compositions B, D, E, F and G successfully remove residues from substrates having a titanium metallurgy while reducing or eliminating attack on the titanium metallurgy. Increased amounts of catechol or gallic acid produce an improved reduction of attack on the titanium metallurgy. The comparative compositions A, C and H all show substantial attack on the titanium metallurgy, even when a two carbon atom linkage alkanolamine compound is used in the absence of gallic acid or catechol. When gallic acid or catechol is used with an alkanolamine compound other than a two carbon atom linkage alkanolamine compound, the gallic acid or catechol does not show a similar reduction of attack of the composition on the titanium metallurgy.

It should now be readily apparent to those skilled in the art that a novel composition and process capable of achieving the stated objects of the invention has been provided. The improved two carbon atom linkage alkanolamine compound based composition and process using such a composition of this invention is suitable for meeting current semiconductor fabrication requirements. The composition and process is suitable for removing photoresist residues and other residues from wafers and other substrates including one or more titanium metal layers without substantial attack on such titanium layers.

It should further be apparent to those skilled in the art that various changes in form and details of the invention as shown and described may be made. It is intended that such changes be included within the spirit and scope of the claims appended hereto.

What is claimed is:

1. A process for removal of residue from a substrate, which comprises contacting the substrate with a composition comprising:

(a) alkanolamine compound selected from the group consisting of monoethanolamine, isopropanolamine, 2-amino-1-propanol, and diglycolamine, (b) a chelating agent (c) an aqueous hydroxylamine solution, and (d) a polar organic solvent for a time and at a temperature sufficient to remove the residue from the substrate.

2. The process of claim 1, wherein the polar organic solvent is selected from ethylene glycol, ethylene glycol alkyl ether, diethylene glycol alkyl ether, triethylene glycol alkyl ether, propylene glycol, propylene glycol alkyl ether, N-substituted pyrrolidone, ethylenediamine, or ethylenetriamine.

3. The process of claim 1, wherein the chelating agent is gallic acid or catechol.

4. The process of claim 3, wherein the gallic acid or catechol is present in an amount of from about 5 percent 30 percent by weight.

5. The process of claim 1, wherein the alkanolamine compound is present in an amount of from about 10 percent by weight to 80 percent by weight.

6. The process of claim 1, wherein the temperature is from about room temperature to 100° C.

7. The process of claim 1, wherein the contact time is from about 2 to 60 minutes.

8. The process of claim 1 wherein the composition comprises two of said alkanolamine compounds.

9. The process of claim 1 wherein the aqueous hydroxylamine solution comprises 50% by weight hydroxylamine and is present in an amount from about 5% by weight to about 50% by weight to 50% by weight of the composition.

10. The process of claim 1 wherein the composition comprises between about 10% to about 30% of an about 50% by weight aqueous hydroxylamine solution, and wherein the alkanolamine is present in an amount of from about 10% to about 80% by weight.

11. The process of claim 1 wherein the composition comprises about 10% of an about 50% by weight aqueous hydroxylamine solution.

12. The process of claim 1 wherein the composition comprises about 10% of an about 50% by weight aqueous hydroxylamine solution and about 5% of a chelating agent.

13. The process of claim 1 wherein the residue comprises organometallic and metal oxide residue.

\* \* \* \* \*

UNITED STATES PATENT AND TRADEMARK OFFICE
CERTIFICATE OF CORRECTION

PATENT NO. : 6,399,551 B1
DATED : September 4, 2003
INVENTOR(S) : Wai Mun Lee

It is certified that error appears in the above-identified patent and that said Letters Patent is hereby corrected as shown below:

Column 6,
Line 21, after "(a)" insert -- an --;
Line 24, after "agent" insert -- , --.
Line 38, after "percent" insert -- to --.
Line 52, delete "to 50% by weight", so claim 9 reads as:
9. The process of claim 1 wherein the aqueous hydroxylamine solution comprises 50% by weight hydroxylamine and is present in an amount from about 5% by weight to about 50% by weight of the composition.

Signed and Sealed this

Twenty-seventh Day of January, 2004

JON W. DUDAS
*Acting Director of the United States Patent and Trademark Office*